United States Patent [19]

Quilter

[11] 4,321,554

[45] Mar. 23, 1982

[54] TIME-DELAYED, VARIABLE OUTPUT CURRENT LIMITING MEANS FOR POWER AMPLIFIERS

[75] Inventor: Patrick H. Quilter, Laguna Beach, Calif.

[73] Assignee: QSC Audio Products, Inc., Costa Mesa, Calif.

[21] Appl. No.: 111,687

[22] Filed: Jan. 14, 1980

[51] Int. Cl.$^3$ .............................................. H03F 3/04
[52] U.S. Cl. .................................... 330/298; 330/297
[58] Field of Search .................... 330/207 P, 267, 297, 330/285, 298

[56] References Cited

U.S. PATENT DOCUMENTS 3,449,680  6/1969  Schilb et al. .................... 330/207 P
3,644,832  2/1972  Sherman, Jr. .................... 330/285 X Primary Examiner—James B. Mullins
Attorney, Agent, or Firm—Philip M. Hinderstein

[57] ABSTRACT

In a power amplifier including a power output stage connectable to a load having a minimum rated impedance, there is disclosed means for driving the power output stage so as to prevent excess power dissipation thereby caused by loads having impedances lower than the minimum rated impedance. A capacitor is utilized to establish a desired voltage level for an amplification stage which provides the current for the power output stage, the maximum current being determined by the voltage level on the capacitor. Means are provided for charging the capacitor to the desired voltage level, the charging means being incapable of maintaining the desired voltage level on the capacitor in the presence of currents from the amplification stage at or near the maximum desired output current. A portion of the output of the power output stage is fed back to the capacitor to maintain the charge thereon at the desired voltage level; however, this is only operative when the impedance of the load is equal to or greater than the rated minimum impedance so that in the event of lower impedances, the charge on the capacitor is not maintained, reducing the current limit from the amplification stage.

16 Claims, 5 Drawing Figures

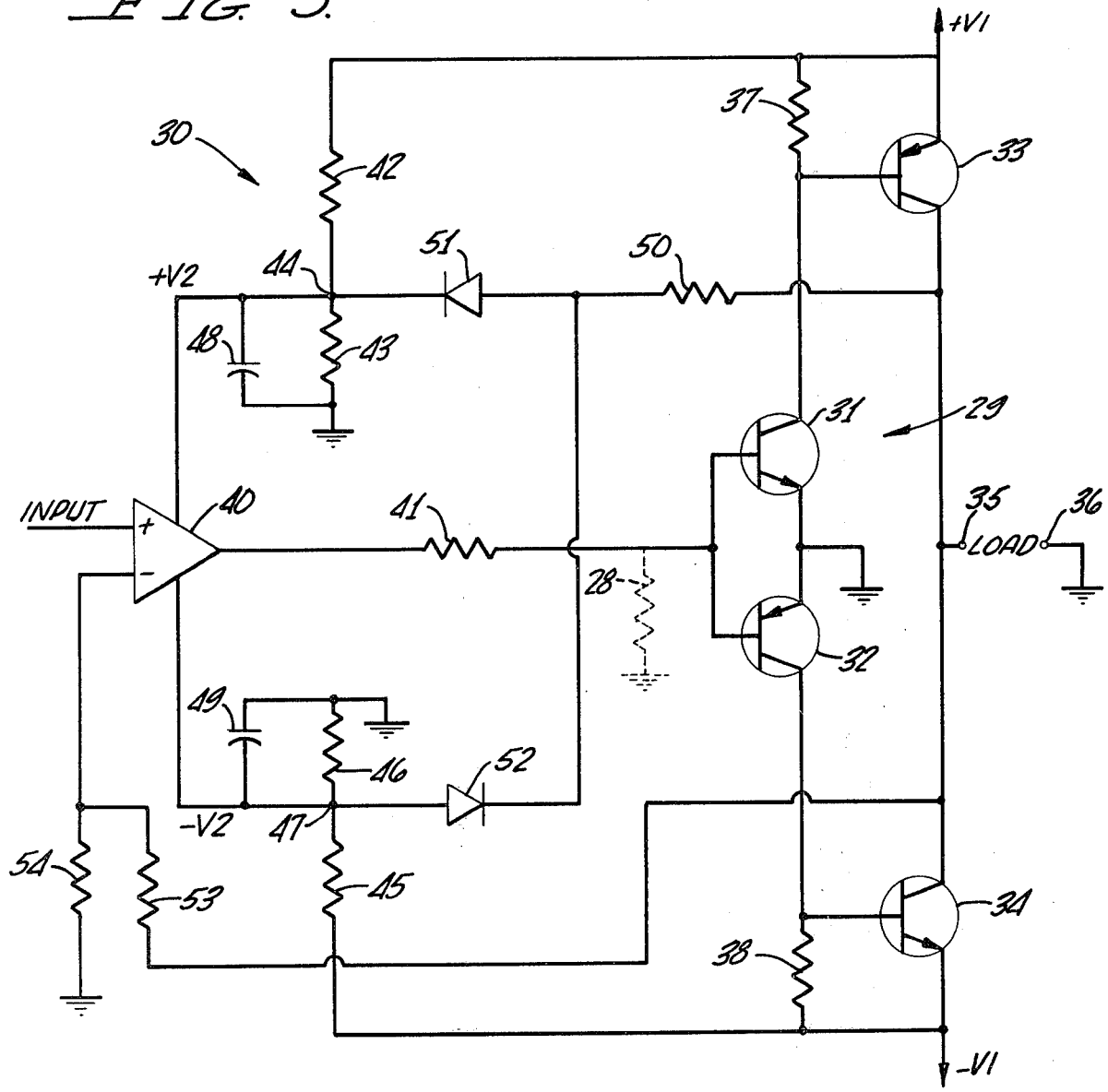

TIME-DELAYED, VARIABLE OUTPUT CURRENT LIMITING MEANS FOR POWER AMPLIFIERS

BACKGROUND OF THE INVENTION

1. Field of the Invention

The present invention relates to a time-delayed, variable output current limiting means for power amplifiers and, more particularly, to means for driving the power output stage of a power amplifier so as to prevent excessive power dissipation thereby caused by loads having impedances lower than the minimum rated impedance.

2. Description of the Prior Art

In the field of power amplifiers, especially solid state power amplifiers, it is usually necessary to provide some means for protecting the power transistors of the power output stage from excessive power dissipation which might be caused by excessively low impedances or short-circuited loads. As is known, if such conditions are not corrected, excessive heating of the power transistors will result, leading to failure due to exceeding the rated safe operating area (SOA).

There are two basic approaches to protecting power output stages from excessive power dissipation, i.e. to increase the capacity of the power transistors or to insure some form of power limitation so that the rating of the devices cannot be exceeded. The first approach involves the addition of more transistors or the use of higher rated devices until the transistors can handle the full overload rating of the amplifier power supply. This "brute force" solution is very costly, since typical amplifier power supplies can supply short-term overload powers of at least ten times their rated outputs. Since SOA damage can occur in a fraction of a second, this approach requires massive overuse of relatively expensive power transistors, far beyond the design requirements dictated by normal operation into rated loads.

The second approach of insuring some form of power limitation has been achieved in a variety of different ways. One way involves the use of power interruption devices, such as fuses and the like. However, in order to be effective, this approach also calls for the use of excessive numbers of power transistors. That is, in order to meet professional audio standards, the power amplifier should be capable of continuously delivering full output currents into the minimum impedance load for which it is rated. This sets the minimum value of the fuse or other current limiting device. Since all practical current interrupters require a substantial fraction of a second, at several times their steady state current, before they will act to break the current, the power transistors must be rated to carry this additional load, which is many times the SOA dissipation required for safe operation into rated loads. Furthermore, when using a current interrupter, the amplifier operation is interrupted when it is activated, requiring fuse replacement, manual reset, or a complex auto-reset circuit before operation can resume. This is a major drawback in professional audio applications where "the show must go on."

There are several circuits which allow normal, rated currents to flow, but establish a ceiling above this value, beyond which currents are not allowed to increase. This, of course, sets a limit on the power dissipation into short-circuit and low impedance loads. This approach is certainly the more desirable, but there may still be drawbacks, depending upon the exact circuit used.

One common prior art circuit, generally designated 10, is shown in FIG. 1. In circuit 10, the output current from a power transistor 11 is sensed by sensing the voltage across a resistor in series with the output current, such as a convenient emitter resistor 12. The voltage from resistor 12, which may be scaled as desired by a resistive divider network including resistors 13 and 14, is applied to the base of a transistor 15. When the voltage across resistor 12 rises to a level high enough to turn transistor 15 on, transistor 15 will shunt the drive current from transistor 11, thus preventing further rise of current through transistor 11.

While the operating point (current limit) of circuit 10 may be scaled conveniently by scaling the values of resistors 12, 13, and 14, there are several important drawbacks. First, the operating point depends on the forward base voltage of transistor 15 which, like all transistors, is temperature dependent. This causes a variation of current limit with temperature. Possibly more objectionable is the fact that the turn-on voltage of transistor 15 is not an abrupt value. Actually, transistor 15 begins to turn on gradually, with a typical voltage spread of 20–25% between initiation of conduction and full conduction. This creates a grey area of current output where the current has not reached its final limits, but is beginning to be limited. In practical terms, this area of operation cannot be used in high-quality amplification systems because this non-linear operation results in rising distortion as the maximum current limit is approached. This "soft-knee" current limit, combined with the temperature variation, means that a substantial margin of error, at least 30–40%, must be allowed, over and above the maximum desired output current, before full current limiting can be expected. This excess dissipation detracts proportionally from the usefulness of circuit 10. In addition, added circuit elements are required, certain attractive circuits cannot be used because they do not have convenient resistors in the output current path, and the drive currents must also be limited, since there is a limit to the amount of current which transistor 15 can absorb. All of this amounts to substantial extra complexity, trouble shooting, and reliability problems.

A second prior art approach to current limiting takes advantage of the fact that transistors have a fairly definite current gain (beta). Therefore, if you limit the drive current, by any convenient method, then the output current will automatically be limited to this value, multiplied by the beta of the output transistors. Such a scheme has the advantage that current limiting does not depend on external circuits, except for the circuits used to limit the drive current, but it suffers from a common feature of practical power transistors. That is, in commercially available devices, the beta is higher when there is a greater voltage across the transistor and falls off as the device approaches saturation (mimimum collector-emitter voltage). This is shown graphically in FIG. 2, which shows actual and ideal curves 17 and 18, respectively, of collector current versus collector-emitter voltage.

Observing curve 17, which represents output current for a fixed drive current, three regions may be noted between points A and B, B and C, and C and D. The region between points A and B represents the saturation region, where the transistor is fully turned on and has only a small voltage across it. The region between points B and C shows the quasi-saturation region. The region between points C and D represents the typical area of operation for the transistor. Commercial requirements call for developing the maximum power possible across the load from a given power supply. This requires that the transistor be driven hard enough to reach point C, if not point B, so that there is minimum voltage loss in the device at the peak signal levels encountered. Thus, in order to use this current limiting scheme, the drive current limit must be set high enough to obtain the desired output current with the transistor at point C or B. However, when the output is shorted, the transistor is exposed continuously to the full power supply voltage, forcing it to operate at point D. Since the gain is typically twice as high at this voltage, the output current is double that which was set into rated loads. Thus, this scheme too tends to allow a higher than necessary current into a short-circuited load than is needed to drive valid loads. There are also temperature variations, although these are often not excessive in practical cases. The circuit does have the advantage of simplicity and is free of the "soft-knee" distortion problem mentioned previously, but substantial overrating of power transistors is still necessary for fool-proof operation.

In view of the above, it can be appreciated that the ideal short-circuit protection scheme would allow maximum rated currents to flow into rated loads, but would actually reduce, rather than merely limit, the current into shorted loads. For instance, if short-circuit currents could be reduced to 50% of the normal rated current, instead of the 150% levels promised by the foregoing schemes, one can obtain reduced short-circuit dissipation by a factor of three, a major improvement. The literature shows a circuit, shown in FIG. 3, generally designated 20, known as V-I limiting, which can achieve this effect.

As can be seen, circuit 20 is identical to circuit 10, except for the addition of a resistor 16 between the base of transistor 15 and the power supply. By adding resistor 16, circuit 20 not only senses the current through resistor 12, as previously described, but also senses the voltage across transistor 11. The result is to permit higher currents to flow when the voltage across transistor 11 is low (representing peak currents into resistive loads), but to permit progressively lower currents to flow through transistor 11 as the voltage across resistor 16 increases. This characteristic is graphed in FIG. 4, which shows a series of curves of the current through transistor 11 versus the voltage thereacross. Curve 21 shows the straight current limit without resistor 16 whereas curve 22 shows the voltage-dependent current limit with resistor 16. Both schemes can be set for the same peak currents when operating into rated resistive loads, shown as point E; however, even an ideal current limit would permit the same value of current to flow with shorted loads (point F). The V-I scheme, however, cuts the short circuit current to the value shown at point G, which can be made almost arbitrarily low.

The problem comes when operating into real-life speaker loads which have significant reactive components. A reactive load line 23 will be in the form of a circle or an ellipse (a mildly reactive ellipse is shown). It will be noted that there are two possible current limit points, points H and I. Depending upon whether the reactance is inductive or capacitive, which in actual speakers varies with brand and frequency, the power amplifier may enter limiting at one of the points and then be forced to jump to the other point. This behavior is usually called "fly back pulses" or "fly back thumps", and is heard as a gross snapping distortion, usually on bass notes. This virtually rules out the use of this circuit in professional audio applications where the amplifier will be driven heavily. In addition, all of the objections raised in discussing FIG. 1. also apply.

It is a common practice among professional audio users to bridge the output of a stereo amplifier to drive a single load at higher impedance. For instance, a stereo amplifer might be rated to deliver 300 watts at 4 ohms, each channel. If you reverse the phase of the signal to one channel and bridge the speaker across the output terminals of the two channels, the output voltage swing will be double that of either channel. Since the current limits are still the same, such an amplifier would now deliver 600 watts to a single 8-ohm load. Such a hookup can be used in multiple-speaker systems to deliver power to many speakers while keeping the impedance high to avoid cable losses. For instance, the output voltage of a 300 watt, 4-ohm amplifier is 35 volts rms, so that bridging two channels gives 70 volts, a proper voltage for driving a common commercial 70 volt speaker distribution line.

Assuring valid short circuit protection for this type of hookup is especially difficult, as the two channels are effectively in series. In order to share the dissipative stress equally, it is necessary to ensure that each channel carriers an equal share of the output voltage. (Since the channels are in series, the current, by definition, must be equal). Schemes involving pure current limiting are chancy unless the current limits are exactly equal; otherwise, the channel with the lower current limit will reach limiting first, the other channel will not reach its (higher) current limit and will remain active, and may proceed much closer to saturation. Consequently, the channel with the lesser current limit will wind up with most of the output voltage imposed across it; in the worst case, twice the value that it would see in normal operation. Such overstress will normally be well beyond the design limits so that short circuit protection in the bridge configuration is not assured.

The V-I scheme guarantees that this wil happen. Whichever channel happens to limit first will have increased voltage imposed on it by the remaining channel, as above. Since the V-I scheme acts to reduce the current limit with increasing voltage, the limiting channel will have ever-decreasing current limits until the full bridged output voltage has been reached. Although the short circuit currents will be reduced by the V-I scheme, as intended, the double-voltage overstress will still occur, and oscillations are extremely likely as the two channels react with each other.

Another way of assessing these results is to consider that a pure current-limited output acts (by definition) as a current source; placing two current sources in series cannot produce a well-defined output voltage. The V-I scheme, once into limiting, acts as a negative output reistance; two such sources in series creates an unstable, oscillatory condition.

What is needed to correct these problems is a less-than-"pure" current limit; i.e. a current limit which is higher at high voltages than at low voltages. This is curve 17 shown in FIG. 2. Two channels having this type limiting need only be approximately matched. Whichever channel limits first will tend to have increased voltages imposed by the other channel, as above; however, this increased voltage will enable a slightly higher current limit, and slightly less in the other channel, until they reach a definite sharing of voltage where their current limits are equal. In other words, since this type of current limit can be viewed as a current source, degenerated from the usual infinite impedance to a definite positive, resistive output impedance, it is possible for two roughly matched channels to reach a definite, reasonably balanced sharing of the short circuit stress.

SUMMARY OF THE INVENTION

According to the present invention, there is provided a circuit which will allow maximum rated currents to flow into rated loads and which will actually reduce, rather than merely limit, the current into shorted loads. The present circuit establishes an initial current limit by using beta-dependent limiting as described previously. The initial drive current limit is made to depend on an internal voltage level which is initially established by a simple resistive divider from the main power supply. A second circuit is arranged to maintain this voltage level and, thus, the maximum current limit, by detecting and rectifying the output voltage. If the load is shorted, the output voltage will be clamped to a low level. In this case, the second circuit cannot operate and the internal voltage will collapse to a lower value, thus reducing the current limit to a lower value which the output transistors can safely handle. A capacitor is used to hold the internal voltage, the value of which determines the time delay before the current limit decays to the lower, safer value after attempted operation into a shorted load. Normal operation resumes as soon as the short is removed and the capacitor recharges.

Therefore, with the present approach, it is not necessary to increase the transistor capacity, to add more transistors, or to use higher rated devices. It is also not necessary to use power interruption devices. The present circuit is not temperature dependent and proper operation does not depend upon the turn-on voltage of a transistor or a diode junction. The present circuit is simple, minimizing trouble shooting and reliability problems.

Briefly, a power amplifier with means for limiting the output current thereof according to the present invention comprises power output means, having an input and an output, for amplifying signals applied to the input, the output being connectable to a load having a minimum rated impedance; amplification means having a signal input, a signal output coupled to the input of the power output means, and a supply voltage input, the output current of the amplification means being a function of the voltage level at the supply voltage input; charge storage means coupled to the supply voltage input of the amplification means for establishing a voltage level therefor; voltage supply means for charging the charge storage means to a desired voltage level sufficient to permit the amplification means to deliver to the power output means a desired maximum current, the voltage supply means being incapable of maintaining the desired voltage level on the charge storage means in the presence of input signals to the amplification means which produce output currents at or near the desired maximum current; and feedback means coupled between the output of the power output means and the charge storage means for feeding a current back to the charge storage means for charging same to maintain the desired voltage level thereon, the feedback means being operative only when the impedance of the load is equal to or greater than the minimum rated impedance.

OBJECTS, FEATURES AND ADVANTAGES

It is therefore an object of the present invention to solve the problems encountered heretofore in driving the power output stage of a power amplifier in a manner so as to prevent excessive power dissipation thereby caused by loads having impedances lower than the minimum rated impedance. It is a feature of the present invention to solve these problems by providing a scheme which will allow maximum rated currents to flow into rated loads, but which will actually reduce, rather than merely limit, the current into low impedance loads. An advantage to be derived is that power transistors are protected against excessive power dissipation caused by excessively low impedance or short circuit loads. A further advantage is that this is achieved without increasing the transistor capacity. A still further advantage is that power interruption devices are not required.

Another advantage is that normal operation resumes as soon as the short is removed. Still another advantage is that the circuit is not temperature dependent. Still another advantage is that the circuit does not depend on the turn-on voltage of a transistor. Still another advantage is that the circuit is free of the "soft-knee" distortion problem. Still another advantage is that the circuit is fully operative when operating into real life speaker loads which have significant reactive components, without the presence of flyback pulses or nuisance tripping. Another advantage is that safe operation is permitted with two channels bridged.

Still other objects, features, and attendant advantages of the present invention will become apparent to those skilled in the art from a reading of the following detailed description of the preferred embodiment constructed in accordance therewith, taken in conjunction with the accompanying drawings wherein like numerals designate like parts in the several figures and wherein:

BRIEF DESCRIPTION OF THE DRAWINGS

FIG. 5 is a circuit diagram of the preferred embodiment of the present invention.

DESCRIPTION OF THE PREFERRED EMBODIMENT

Figure 1:
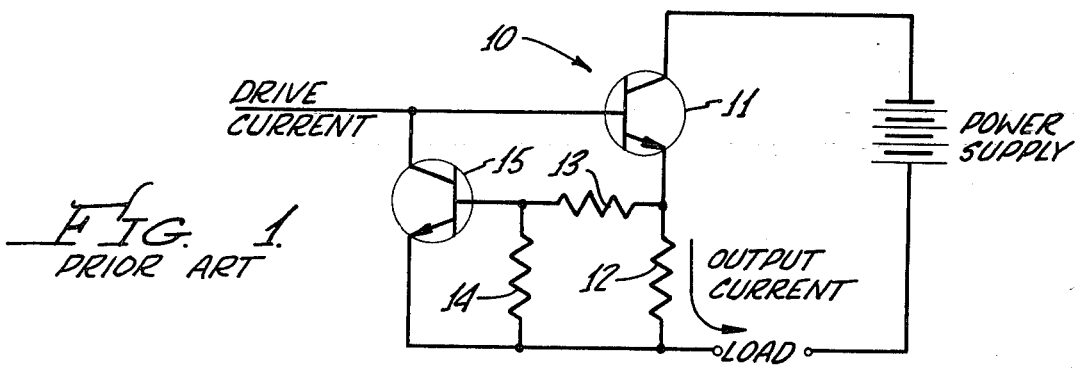
FIGS. 1 and 3 are circuit diagrams of prior art output current limiting circuits.
Figure 2:
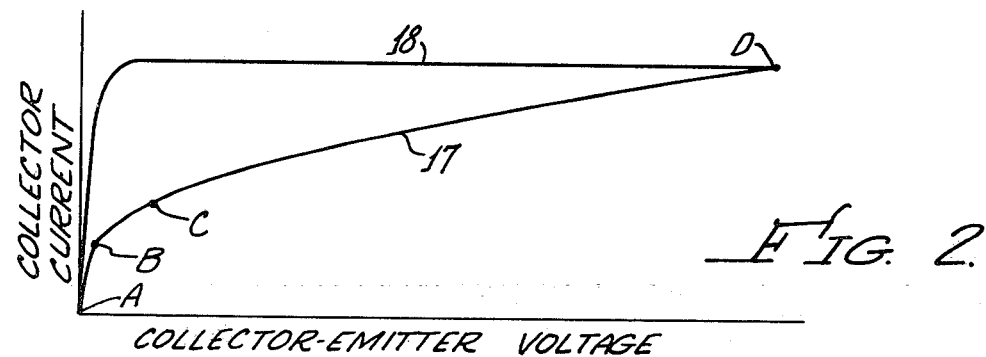
FIGS. 2 and 4 are plots showing typical conduction curves for fixed base current, variable collector-emitter voltages for prior art circuits.
Figure 3:
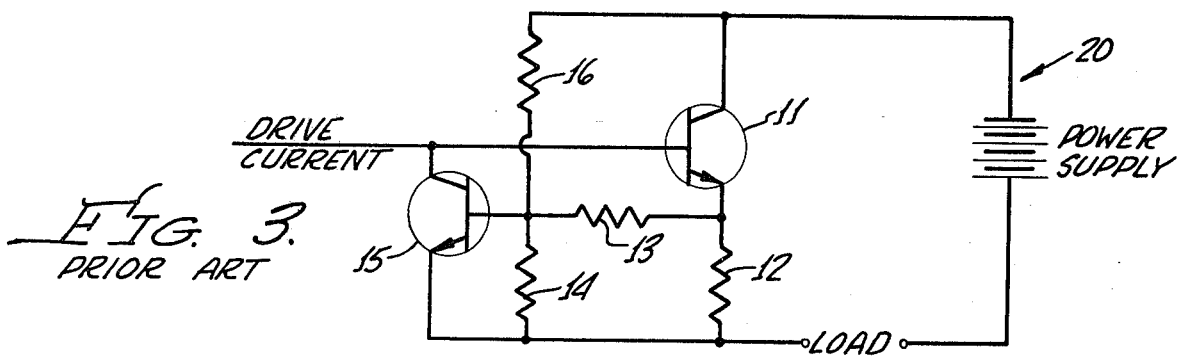
Figure 4:
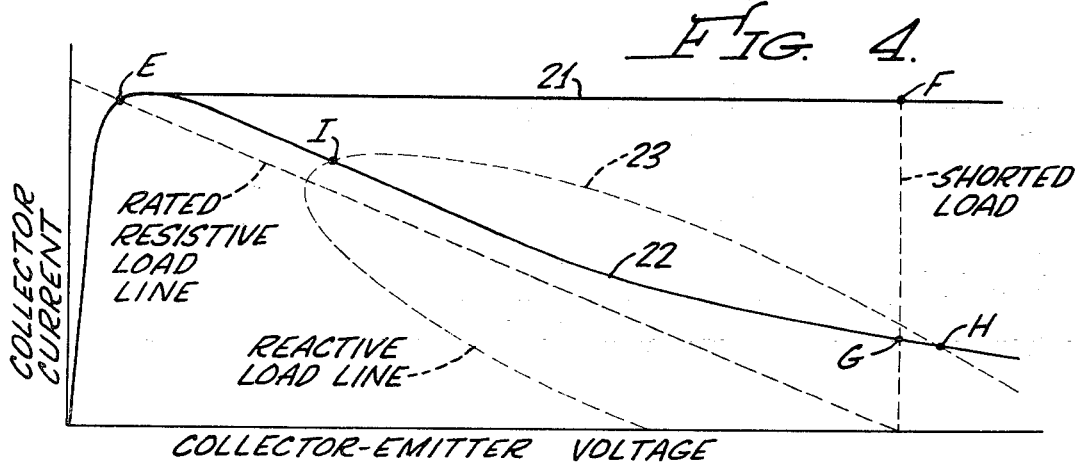

Referring now to FIG. 5, there is shown a power amplifier circuit, generally designated 30, incorporating the present invention. In circuit 30, +V1 and −V1 represent the power supply sources of a generalized bipolar power amplifier circuit. Transistors 31-34 represent a generalized, known, power transistor output stage 29 of a type suitable for use in the present invention. The arrangement shown in FIG. 5 is, however, one of many convenient arrangements and others may be used, subject to the assumptions that the final devices are capable of delivering the desired voltages and currents to the speaker loads and that the input devices require a reasonably definite input current and voltage in order for the output devices to deliver rated powers.

More specifically, in power output stage 29, the collectors of transistors 33 and 34 are shown connected together and to a first output terminal 35 which is adapted to be connected to the load, the load also being connectable to a terminal 36 connected to ground. The emitters of transistors 33 and 34 are connected to +V1 and −V1 respectively. The base of transistor 33 is connected via a bias resistor 37 to +V1 and to the collector of transistor 31. The base of transistor 34 is connected via a bias resistor 38 to −V1 and to the collector of transistor 32. The emitters of transistors 31 and 32 are connected to ground. The bases of transistors 31 and 32 form the input of power output stage 29 and are connected together.

Power amplifier 30 also includes amplification means 40 having complimentary inputs, an output, and positive and negative supply voltage inputs. Amplification means 40 may be any suitable gain circuit capable of delivering the needed currents and voltages to the inputs of transistors 31 and 32. Thus, the output of amplification means 40 is connected via a resistor 41 to the bases of transistors 31 and 32. The signal input for amplifier 30 is connected to the positive input terminal of amplification means 40.

Amplification means 40 is, preferrably, a commerically available integrated circuit operational amplifier (op-amp) or an equivalent discrete structure. The idle current of op-amp 40 should be less than its peak output current, for reasons which will appear more fully hereinafter.

Op-amp 40 operates from two reduced voltage power supplies, designated as +V2 and −V2, which are connected to the supply voltage inputs. Assuming that op-amp 40 will swing its output voltage over a known amount, depending upon the value of +V2 and −V2, a known current, also dependent on the values of +V2 and −V2, will flow through resistor 41 to the input of power output stage 29. Thus, the values of +V2 and −V2 ultimately determine the maximum output current available from op-amp 40 and power output stage 29. If desired, resistor 41 may be made into a resistive voltage divider network by coupling it via a resistor 28 to ground in order to enhance this dependency and to scale the current and voltage levels required by transistors 31 and 32.

Power supply +V2 is established by a voltage divider network consisting of resistors 42 and 43 connected between +V1 and ground, the junction 44 between resistors 42 and 43 being connected to the positive supply voltage input of op-amp 40. Power supply −V2 is established by a voltage divider network consisting of resistors 45 and 46 connected between −V1 and ground, the junction 47 between resistors 45 and 46 being connected to the negative supply voltage input of op-amp 40. A charge storage means, preferrably a capacitor 48, is connected between junction 44 and ground, whereas a charge storage means, preferrably a capacitor 49, is connected between junction 47 and ground.

Completing the description of power amplifier 30, there is included a feedback network including a resistor 50 connected between output terminal 35 and first ends of diodes 51 and 52, the other ends thereof being connected to junctions 44 and 47, respectively. The output of power output stage 29 is also fed back to the negative input terminal of op-amp 40 by means of resistors 53 and 54 connected between terminal 35 and ground, the junction therebetween being connected to op-amp 40.

In operation, when circuit 30 is first energized, and comes to rest, the resistive divider networks consisting of resistors 42, 43, 45, and 46, combined with the idle current, if any, of op-amp 40 establishes the initial values of +V2 and −V2. These values, along with the value of resistor 41, are set to permit op-amp 40 to deliver to power output stage 29 a desired maximum current which will develop the maximum output current that power output stage 29 is expected to deliver into minimum rated loads. Capacitors 48 and 49 serve to smooth and store the voltage at junctions 44 and 47, respectively. The capacitance of capacitors 48 and 49 determines the rate at which this voltage can change and, accordingly, the time delay before the output current limit can change. Normally, this time interval is set to be much longer than the period of the lowest frequency which will be amplified, i.e. approximately 0.5 seconds for audio signals in the range of 20–20,000 Hz.

Assume now that a substantial signal is inserted into the input of op-amp 40, a signal which will produce output currents therefrom at or near the desired maximum current. Assuming also that resistors 53 and 54 form a generalized feedback structure designed to force a known relationship between the input of op-amp 40 and the output between terminals 35 and 36, there will be an amplified output signal presented to the load. In order to develop this output, a certain amount of current will be drawn from the internal power supplies, +V2 and −V2 in order to drive power output stage 29. Since these power supplies are fed by unregulated resistive dividers, the voltage levels on capacitors 48 and 49 will normally tend to decline, causing a progressive fall off of output current limits. In other words, because the equivalent impedance of resistors 42 and 43 and resistors 45 and 46 is high compared to the output impedance of op-amp 40, the internal power supplies +V2 and −V2 are incapable of maintaining the desired voltage level on capacitors 48 and 49 in the presence of input signals to op-amp 40 which produce output currents at or near the desired maximum current.

On the other hand, this effect is countered by resistor 50 and diodes 51 and 52. That is, resistor 50, being connected to the audio voltage which is being delivered to the load, passes a certain amount of current back to junctions 44 and 47 via diodes 51 and 52, respectively. The polarities of these two diodes are arranged so that this current is rectified and used to recharge or maintain the desired voltage levels across capacitors 48 and 49, thus stabilizing the values of +V2 and −V2 and maintaining the original current limits.

The above assumes that the impedance of the load between terminals 35 and 36 is equal to or greater than the minimum rated impedance. That is, the circuit values of resistors 43, 46 and 50 are chosen so that with a minimum rated load impedance, diodes 51 and 52 are forward biased and there is enough current flow to keep capacitors 48 and 49 charged. On the other hand, when the impedance of the load drops below the minimum rated impedance, the normal current limit of the circuit can no longer develop full voltage across the load. At this time, the usual action of feedback resistors 53 and 54 will be demanding full output from op-amp 40 in order to attempt full current drive from power output stage 29. Hence, the current drain from capacitors 48 and 49 will be at a maximum. However, since the output voltage peaks are now less than normal because the impedance of the load is below the minimum rated impedance, the amount of current being fed back through resistor 50 is less than normal. This allows the voltages on capacitors 48 and 49 to flow to lower values, thus reducing the output current limit (because of the aforementioned dependency of the output current limit on the values of $+V2$ and $-V2$). This will further limit the output voltage which can be developed across the load which will further reduce the currents through resistor 50. The circuit will eventually stablize at a new level where the current available through resistor 41 is reduced only to that available through resistors 42 and 45, which is set to be rather minimal. Thus, under a low impedance or short circuit condition, the output current limit is reduced to a much lower value than would be available to a normal load.

It will also be apparent that if the input signal is removed, capacitors 48 and 49 will recharge to their normal values, preparing op-amp 40 to again deliver its rated maximum current. However, as long as the output load is below the critical impedance, the circuit cannot deliver a sustained, high current level which might damage the power output stage. Furthermore, when the load is restored to its correct impedance, the circuit will automatically resume normal full power operation.

It will therefore be appreciated that, in effect, circuit 30 measures the impedance of the load by looking for a certain voltage to be developed thereacross in accordance with a certain current output and that this measurement does not depend on the reactive characteristics of the load. The full output current is maintained for an indefinite time into valid loads, but the output current will decline after the time interval established by capacitors 48 and 49 when driven into low impedance or shorted loads. In essence, this establishes two levels of protection, which characteristic matches well with the ability of power transistors to withstand short term, moderate overloads (as established by the initial, higher current limit), while ensuring a long-term dissipation which is low enough not to overwhelm the thermal capacity of the heat sink structure and thus cause destruction under prolonged short circuits.

Limiting is achieved by use of current limiting without resorting to V-I limiting, which can cause undesirable interactions with normal but reactive loads. All limiting occurs smoothly, with immediate restoration of normal operation when the problem is corrected. The circuit effectively establishes two levels of protection, one delayed with respect to the other, preventing unlimited current drain to prevent instantaneous failure of the power output stage, but allowing an increased current for a short period and then reducing such current.

Power amplifier circuit 30 is one of the simplest versions of the present invention and embodies the novel concepts thereof. It will be obvious to those skilled in the power amplifier art that more elaborate implementations are possible for increased performance from amplifier 30. For example, rather than connecting resistors 43 and 46 directly to ground, these resistors can be connected to the bases of transistors 31 and 32, with two diodes (not shown) selected to match the base voltages of transistors 31 and 32, thus minimizing crossover distortion. Resistors can be used in the emitter circuits of transistors 31 and 32 to substantially eliminate the effect of gain variations in transistors 31 and 32 and to create a stabilized, voltage input characteristic to these transistor bases, to better match the output of the resistive divider network consisting of resistors 41 and 28. This more accurately establishes the desired dependency of the output current of power output stage 29 to the value of the voltage at junctions 44 and 47, subject only to gain variations of the output transistors 31-34. These gain variations can be somewhat minimized through the degenerative action of conventional emitter and base resistors (not shown). A capacitor (not shown) may be connected in parallel with resistor 50 to provide extra current at the highest frequencies where additional demand is made to overcome high frequency losses.

Under the above circumstances, circuit 30 can be set so that with reasonable production tolerances, the initial current limit ranges from about 100% to 125% of that desired (this being the approximate gain tolerance of the output transistors), with short circuit currents ranging from 60%–75% of the maximum normal current. This is about half of the typical fixed current limit of 150% which would have been experienced if the voltages at junctions 44 and 47 were simply held constant. Thus, the present circuit arrangement serves well for lower power, less expensive circuits. Other modifications will be obvious to those skilled in the art.

It can therefore be seen that according to the present invention, there is provided a power amplifier 30 which will allow maximum rated currents to flow into rated loads and which will actually reduce, rather than merely limit, the current into shorted loads. Power amplifier 30 establishes an initial current by using beta-dependent limiting as described previously. The initial drive current limit is made to depend on the internal voltage levels $+V2$ and $-V2$ which are initially established by simple resistive divider networks from the main power supplies $+V1$ and $-V1$. A second circuit, including resistor 50 and diodes 51 and 52, is arranged to maintain this voltage level and, thus, the maximum current limit, by detecting and rectifying the output voltage. If the load is shorted, there will not be an output voltage. In this case, the second circuit cannot operate and the internal voltages will collapse to a lower value, thus reducing the current limit to a lower value which the output transistors can safely handle. Capacitors 48 and 49 are used to hold the internal voltages, the values of which determine the time delay before the current decays to the lower, safer value after attempted operation into a shorted load. Normal operation resumes as soon as the short is removed and capacitors 48 and 49 recharge.

While the invention has been described with respect to the preferred physical embodiment constructed in accordance therewith, it will be apparent to those skilled in the art that various modifications and improvements may be made without departing from the scope and spirit of the invention. For example, while the invention was designed to protect the transistors in a solid state amplifier from damage due to shorted loads, the present invention obviously applies to all such amplifiers whose active elements lack intrinsic power limiting into shorted loads and which are subject to damage caused by resultant excess power dissipation. The principles of the present invention are capable of extension into related fields involving electronic amplification and possible load faults, such as in electronic power supply regulators, electronic motor drives, radio frequency transmitter circuits, fluorescent lamp drives and the like. Accordingly, it is to be understood that the invention is not to be limited by the specific illustrative embodiment, but only by the scope of the appended claims.

I claim:

1. A power amplifier with means for limiting the output current thereof comprising:

power output means, having an input and an output, for amplifying signals applied to said input, said output being connectable to a load;

amplification means having a signal input, a signal output coupled to said input of said power output means, and a supply voltage input, the output current of said amplification means being a function of the voltage level at said supply voltage input;

charge storage means coupled to said supply voltage input of said amplification means for establishing a voltage level therefor;

voltage supply means for charging said charge storage means to a desired voltage level sufficient to permit said amplification means to deliver to said power output means a desired maximum current, said voltage supply means being incapable of maintaining said desired voltage level on said charge storage means in the presence of input signals to said amplification means which produce output currents at or near said desired maximum current; and feedback means coupled between said output of said power output means and said charge storage means for feeding a current back to said charge storage means for charging same to maintain said desired voltage level thereon, said feedback means being operative to maintain said desired voltage level only when the impedance of said load is equal to or greater than a desired minimum impedance.

2. A power amplifier according to claim 1, wherein said amplification means comprises:
an operational amplifier.

3. A power amplifier according to claim 1, wherein said charge storage means comprises:
a capacitor.

4. A power amplifier according to claim 3, having a main power supply, wherein said voltage supply means comprises:
a voltage divider network coupled between said main power supply and said capacitor.

5. A power amplifier according to claim 4, wherein the equivalent impedance of said voltage divider network is high compared to the output impedance of said amplification means whereby said main power supply cannot supply sufficient charging current for said capacitor in the presence of input signals to said amplification means which produce output currents at or near said desired maximum current.

6. A power amplifier according to claim 4, wherein said feedback means comprises:
a resistor in series with diode means coupled between said output of said power output means and said charge storage means for feeding back to said charge storage means sufficient current to maintain said desired voltage level thereon, the circuit values of said resistor and said voltage divider network being selected to permit sufficient current to flow to said charge storage means to maintain said desired voltage level thereon only when the impedance of said load is equal to or greater than said desired minimum impedance.

7. A power amplifier according to claim 3, 4, or 5, wherein the value of said capacitor is selected to determine the time delay before said output current of said amplification means begins to decay when the impedance of said load falls below said minimum impedance.

8. A power amplifier according to claim 1, wherein said feedback means detects and rectifies the voltage across said load.

9. In a power amplifier including a power output stage connectable to a load having a minimum rated impedance, means for driving said power output stage so as to prevent excess power dissipation thereby caused by loads having impedances lower than said minimum rated impedance comprising:

amplification means having a signal input, a signal output coupled to the input of said power output stage, and a supply voltage input, the maximum output current of said amplification means being determined by the voltage level at said supply voltage input;

capacitor means coupled to said supply voltage input for establishing the voltage level therefor;

means for charging said capacitor means to a desired voltage level, said charging means being incapable of maintaining said desired voltage level on said capacitor means in the presence of currents from said amplification means at or near said maximum output current; and means coupled across said load and responsive to the voltage thereacross for feeding back a portion of the output of said power output stage to said capacitor means for maintaining the charge thereon at said desired voltage level.

10. In a power amplifier according to claim 9, driving means wherein said feedback means is capable of maintaining said charge at said desired voltage level only when the impedance of said load is equal to or greater than said desired minimum impedance.

11. In a power amplifier according to claim 9 or 10, driving means wherein said amplification means comprises:
an operational amplifier.

12. In a power amplifier according to claim 9 or 10, having a main power supply, driving means wherein said capacitor charging means comprises:
a voltage divider network coupled between sid main power supply and said capacitor means.

13. In a power amplifier according to claim 12, driving means wherein the equivalent impedance of said voltage divider network is high compared to the output impedance of said amplification means whereby said main power supply cannot supply sufficient charging current for said capaitor means in the presence of input signals to said amplification means which produce output currents at or near said maximum output current.

14. In a power amplifier according to claim 12, driving means wherein said feedback means comprises:
a resistor in series with diode means coupled between the output of said power output stage and said capacitor means for feeding back to said capacitor means sufficient current to maintain said desired voltage level thereon, the circuit values of said resistor and said voltage divider network being selected to permit sufficient current to flow to said capacitor means to maintain said desired voltage level thereon only when the impedance of said load is equal to or greater than said desired minimum impedance.

15. In a power amplifier according to claim 10, driving means wherein said voltage level on said capacitor means decays to a lower voltage level when the impedance of said load is less than said desired minimum impedance whereby said output current of said amplification means begins to decay.

16. In a powr amplifier according to claim 15, driving means wherein the value of said capacitor means is selected to determine the time delay before said output current of said amplification means begins to decay.

* * * * *